(12) United States Patent
Weng (10) Patent No.: US 12,261,109 B2
(45) Date of Patent: Mar. 25, 2025

(54) SEMICONDUCTOR STRUCTURE

(71) Applicant: CHANGXIN MEMORY TECHNOLOGIES, INC., Hefei (CN)

(72) Inventor: Kun Weng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 339 days.

(21) Appl. No.: 17/650,853

(22) Filed: Feb. 13, 2022

(65) Prior Publication Data

US 2022/0375849 A1    Nov. 24, 2022

Related U.S. Application Data

(63) Continuation of application No. PCT/CN2021/120348, filed on Sep. 24, 2021.

(30) Foreign Application Priority Data

May 19, 2021    (CN) .......................... 202110546017.7

(51) Int. Cl.
*H01L 23/522* (2006.01)
*H01L 23/528* (2006.01)

(52) U.S. Cl.
CPC ........ *H01L 23/5222* (2013.01); *H01L 23/528* (2013.01)

(58) Field of Classification Search
CPC ... H01L 23/52; H01L 23/522; H01L 23/5223; H01L 23/5225; H01L 23/528; H01L 23/5283; H01L 23/5286
See application file for complete search history.

(56) References Cited

U.S. PATENT DOCUMENTS

| 6,522,007 | B2 | 2/2003 | Kouno |
| 2002/0190382 | A1 | 12/2002 | Kouno |
| 2004/0188849 | A1 | 9/2004 | Suga |
| 2007/0200245 | A1 | 8/2007 | Suga |

(Continued)

FOREIGN PATENT DOCUMENTS

| CN | 1378266 A | 11/2002 |
| CN | 1643525 A | 7/2005 |

(Continued)

OTHER PUBLICATIONS

CN-101128921 (Year: 2008).*

(Continued)

*Primary Examiner* — Thanhha S Pham
(74) *Attorney, Agent, or Firm* — Syncoda LLC; Feng Ma (57) ABSTRACT

A semiconductor structure includes a plurality of metal layers and a substrate. The plurality of metal layers are provided with a plurality of virtual metal blocks and at least one signal line. A first projection of a first virtual metal block on the substrate is a polygon, the first projection has a plurality of effective sides opposite to a second projection of a target signal line on the substrate, and differences from the plurality of effective sides of the first projection to a straight line where the second projection is located are different, and the first virtual metal block is a virtual metal block, closest to the target signal line, on the target metal layer, and the target metal layer is a metal layer where the target signal line is located.

14 Claims, 9 Drawing Sheets

(56) References Cited

U.S. PATENT DOCUMENTS

2008/0164496 A1   7/2008  Kawakami
2011/0248404 A1  10/2011  Chiu
2014/0151832 A1   6/2014  Saiki

FOREIGN PATENT DOCUMENTS

| CN | 101128921 | * | 2/2008 |
| CN | 102270625 A | | 12/2011 |
| CN | 102487056 A | | 6/2012 |
| CN | 104934408 A | | 9/2015 |
| JP | H0661230 A | | 3/1994 |
| KR | 20020050927 A | | 6/2002 |

OTHER PUBLICATIONS

International Search Report in the international application No. PCT/CN2021/120350, mailed on Feb. 23, 2022.
International Search Report in the international application No. PCT/CN2021/120348, mailed on Jan. 27, 2022.
U.S. office action in U.S. Appl. No. 17/650,122, mailed on Aug. 29, 2024.

* cited by examiner

SEMICONDUCTOR STRUCTURE

CROSS-REFERENCE TO RELATED APPLICATIONS

This is a continuation of International Application No. PCT/CN2021/120348 filed on Sep. 24, 2021, which claims priority to Chinese Patent Application No. 202110546017.7 filed on May 19, 2021. The disclosures of the above-referenced applications are hereby incorporated by reference in their entirety.

BACKGROUND

A semiconductor integrated circuit device includes a metal layer deployed with a patterned metal, and a part of metal on the metal layer is configured to transmit signals, such as a clock signal, a control terminal signal of a transistor, and the like.

SUMMARY

The present disclosure relates to but is not limited to a semiconductor structure.

The present disclosure provides a semiconductor structure. The structure includes a plurality of metal layers and a substrate.

The plurality of metal layers are provided with a plurality of virtual metal blocks and at least one signal line.

Virtual metal blocks on two adjacent metal layers are staggered from each other in a direction perpendicular to the substrate.

A first projection of a first virtual metal block on the substrate is a polygon, the first projection has a plurality of effective sides opposite to a second projection of a target signal line on the substrate, and distances from the plurality of effective sides of the first projection to a straight line where the second projection is located are different.

The first virtual metal block is a virtual metal block, closest to the target signal line, on a target metal layer, and the target metal layer is a metal layer where the target signal line is located.

BRIEF DESCRIPTION OF THE DRAWINGS

The accompanying drawings herein are incorporated in and form part of the specification, illustrate embodiments in accordance with the present disclosure, and together with the specification serve to explain the principles of the present disclosure.

Through the above drawings, the specific embodiments of the present disclosure have been illustrated, which will be described in more detail later. These drawings and text descriptions are not intended to limit the scope of the concept of the present disclosure in any way, but to explain the concept of the present disclosure for those skilled in the art by referring to specific embodiments.

DETAILED DESCRIPTION

With the increase of the integrated density of semiconductor integrated circuit devices, especially in some complex integrated circuits, the signal transmission on the metal layer is delayed due to the parasitic effect of patterned metal on the metal layer, which leads to the degradation of the performance of semiconductor integrated circuits. How to reduce the influence of parasitic effect on graphical metal has become an urgent problem to be solved.

Exemplary embodiments will be described in detail herein, and examples thereof are shown in the drawings. When the following description relates to the accompanying drawings, the same numbers in different drawings indicate the same or similar elements, unless otherwise indicated. The implementations described in the following exemplary embodiments do not represent all implementations consistent with the present disclosure. Rather, they are merely examples of devices and methods consistent with some aspects of the present disclosure as detailed in the appended claims.

It should be understood that, singular forms "a/an", "one", and "the" may include the plural forms, unless otherwise specified types in the context. It is also to be understood that, terms such as "comprising/containing" or "having" appoint existence of declarative features, wholes, steps, operations, components, parts or combinations of them, but not excluding the possibility of existence or adding of one or more other features, wholes, steps, operations, components, parts or combinations of them. Meanwhile, in the specification, term "and/or" includes any and all combinations of the related listed items.

Figure 1:
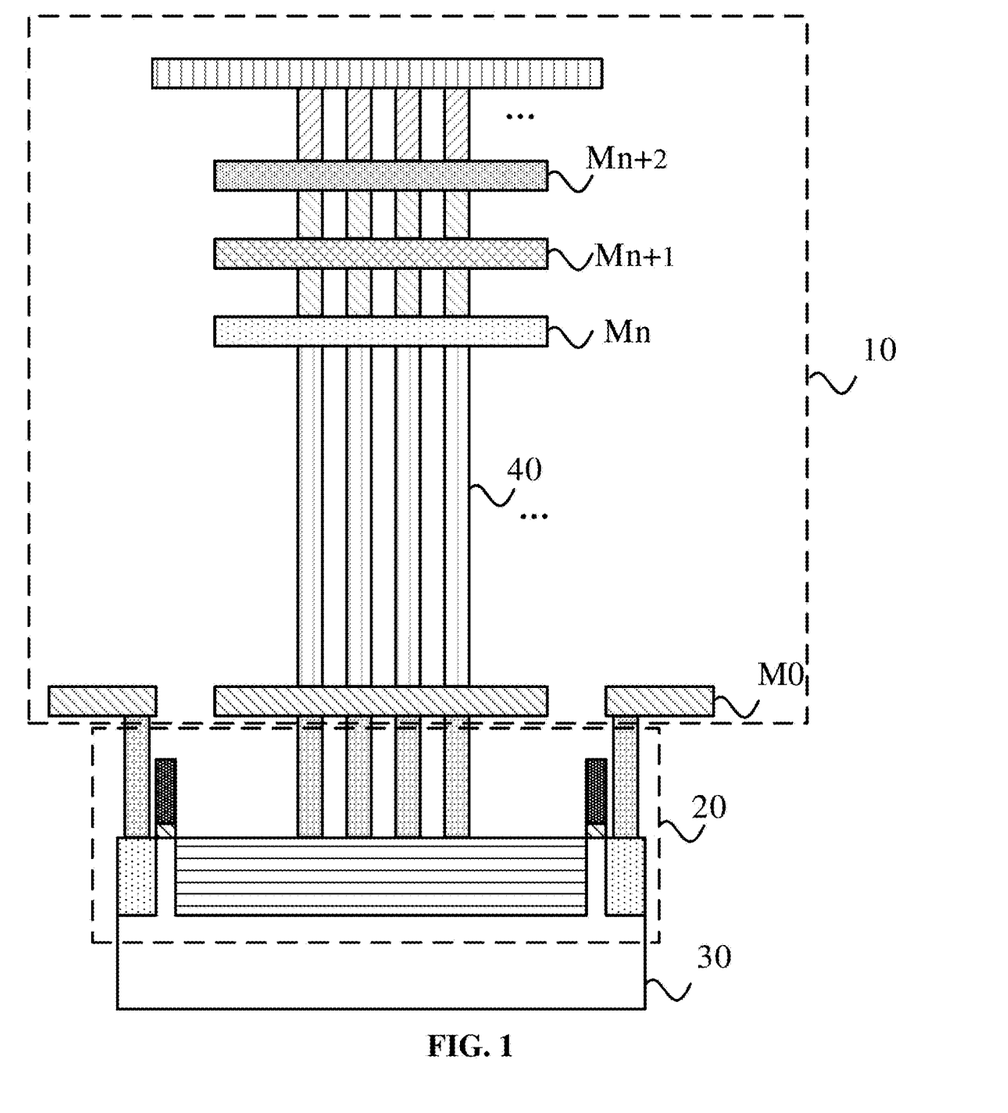
FIG. 1 illustrates a front view of a semiconductor structure according to one embodiment of the present disclosure.

As illustrated in FIG. 1, the semiconductor structure includes a substrate 30, electronic components 20, and a plurality of metal layers 10. An electronic component 20 such as a transistor is provided on the substrate 30. The plurality of metal layer 10 is provided on the electronic component, for example, a metal layer M0, a metal layer Mn, a metal layer Mn+1, and a metal layer Mn+2 whose heights are successively increasing, n being a natural number, that is, the metal layer Mn is higher than the metal layer M0, the metal layer Mn+1 is higher than the metal layer Mn, and the metal layer Mn+2 is higher than the metal layer Mn+1. Each metal layer is electrically connected through a conductive plug 40. Signal lines are arranged on a part of the metal layer 10 that is configured to interconnect various electronic components, and to connect the electronic components to a ground pad or a power supply pad.

A dry etching process is usually adopted to manufacture the signal lines of an integrated circuit. A typical manufacturing process includes the following steps. Firstly, a layout pattern of the signal lines is drew, and then the layout pattern of the signal lines is transferred to a semiconductor base by using a lithography process. The semiconductor base is a semiconductor structure to be dry etched. Then, the semiconductor structure is dry-etched, and the metal layer or the dielectric layer that is not covered by the lithographic medium is removed to form the desired semiconductor structure.

Figure 2:
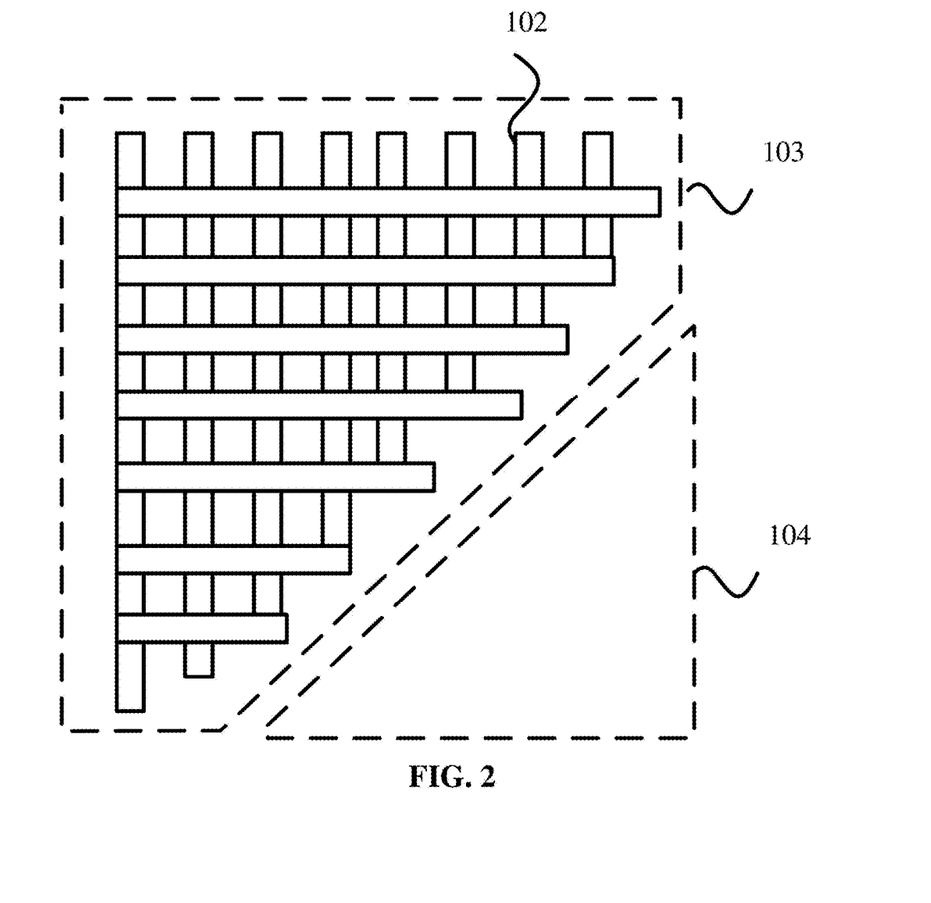
FIG. 2 illustrates a schematic layout diagram of the signal lines according to one embodiment of the present disclosure.
Figure 3:
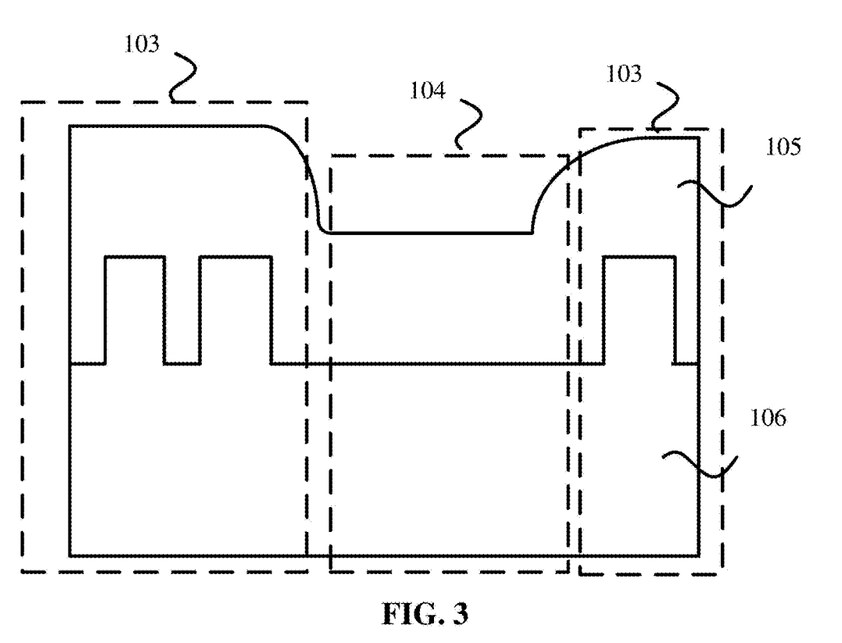
FIG. 3 illustrates a schematic diagram of manufacturing a metal layer in a semiconductor structure according to one embodiment of the present disclosure.

As illustrated in FIG. 2, the distribution of signal lines in each layer is generally non-uniform, and each layer may be divided into a signal line dense region 103 and a signal line sparse region 104 according to the distribution region of the signal lines. The non-uniform distribution of wires affects the process of manufacturing semiconductor structures. As illustrated in FIG. 3. especially in the case where the distance between the two layers exceeds a certain specific value, when the current layer 106 is further covered with a dielectric layer 105, the dielectric layer 105 will be a dished shape in the signal line sparse region 104, resulting in a significant difference in the thickness of the dielectric layer between the signal line dense region 103 and the signal line sparse region 104.

A dry etch process is a chemical or a combination of chemical and mechanical processes whose etching rate depends on the density of the components on the semiconductor base. Because of the non-uniform density of the signal lines on the semiconductor base, the etching rate in the region with high signal line density is significantly different from that in the region with low signal line density, resulting in etching difficulties, which is known as the load effect.

Moreover, another factor affecting the etching process is the thickness of the dielectric layer 105 formed subsequently. Because the densities of the signal lines on the semiconductor base are different, the dished shape is formed in the region where the signal lines are sparse, so that the etching end point is not easy to detect when the dielectric layer etching process is performed, resulting in the occurrence of excessive etching or stopping the etching when the etching end point is not reached. This in turn affects the yield during the process of manufacturing the semiconductor structure.

Figure 4:
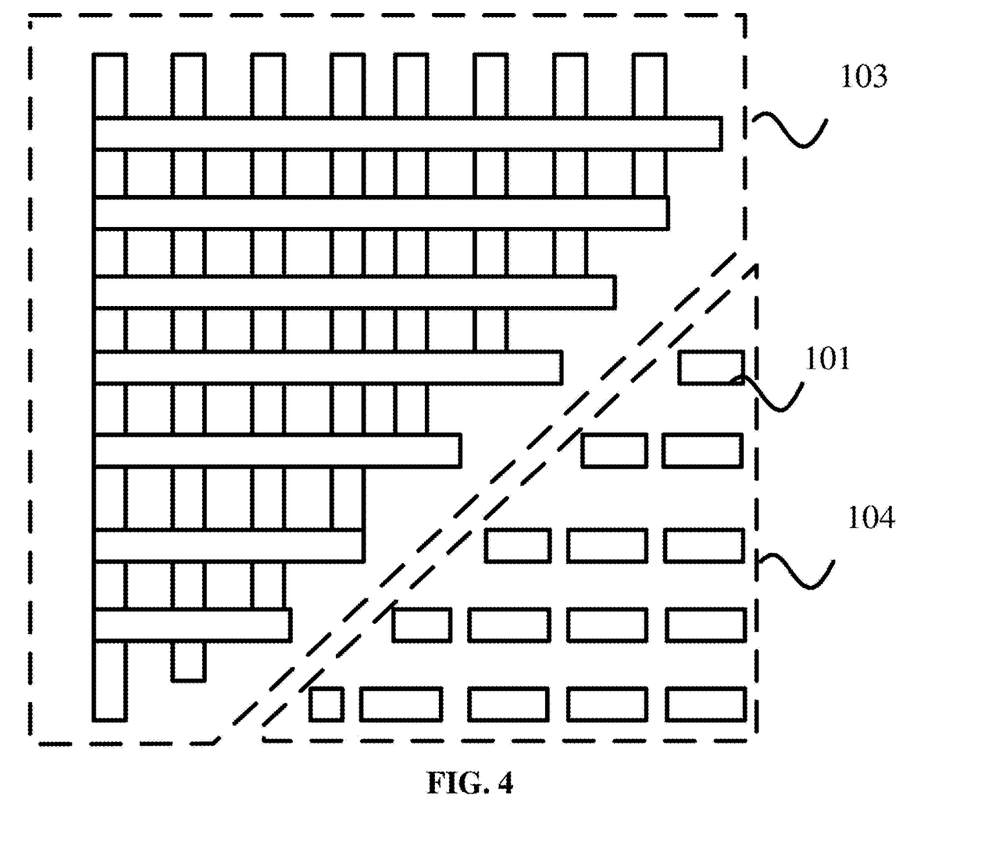
FIG. 4 illustrates a schematic layout diagram of the signal lines and the virtual metal blocks according to one embodiment of the present disclosure.

As illustrated in FIG. 4, in order to overcome the problems caused by non-uniform signal lines, virtual metal blocks are usually arranged in the signal line sparse region of each layer so that the density of the signal line dense region is the same as that of the signal line sparse region. Unlike signal lines, virtual metal blocks do not transmit signals.

Virtual metal blocks may be grounded, connected to the power supply, or floating. Since the parasitic capacitance value is increased when the virtual metal blocks are grounded, or connected to the power supply, the virtual metal blocks are usually floating. It should be noted that the connection state of the virtual metal blocks is not limited herein.

The embodiments of the present disclosure provide a semiconductor structure. The semiconductor structure includes a substrate 30 and a plurality of metal layers 10, each metal layer is provided with signal lines, and virtual metal blocks are provided on the metal layer where the signal lines are not uniformly distributed, so that the wiring on the metal layer is uniform.

Three adjacent metal layers, metal layer Mn, metal layer Mn+1, and metal layer Mn+2 are taken as examples. Signal lines are deployed on the metal layer Mn, the metal layer Mn+1 and the metal layer Mn+2, and the signal lines on the three metal layers are not uniformly distributed. That is, there are signal line dense region and signal line sparse region on each layer.

Figure 5:
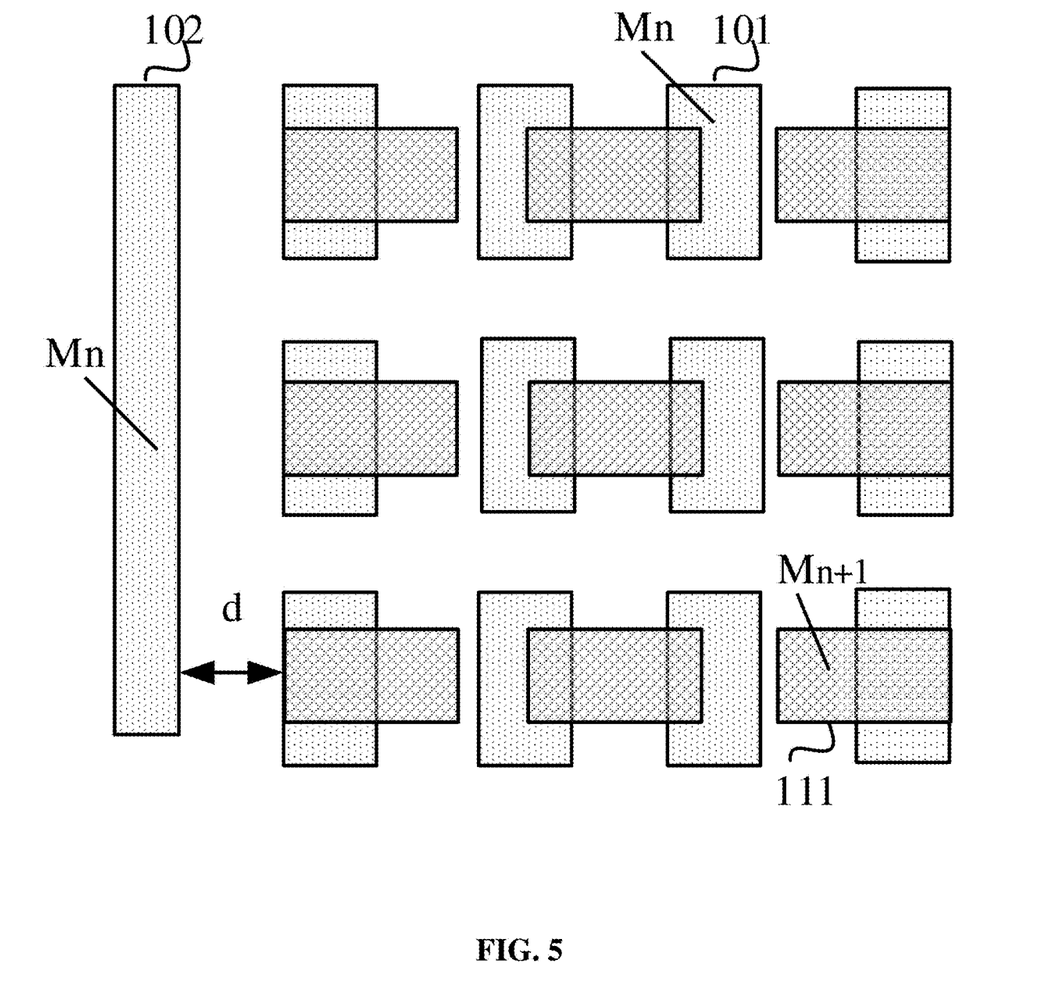
FIG. 5 illustrates a schematic layout diagram of the virtual metal blocks in a semiconductor structure according to one embodiment of the present disclosure.
Figure 6:
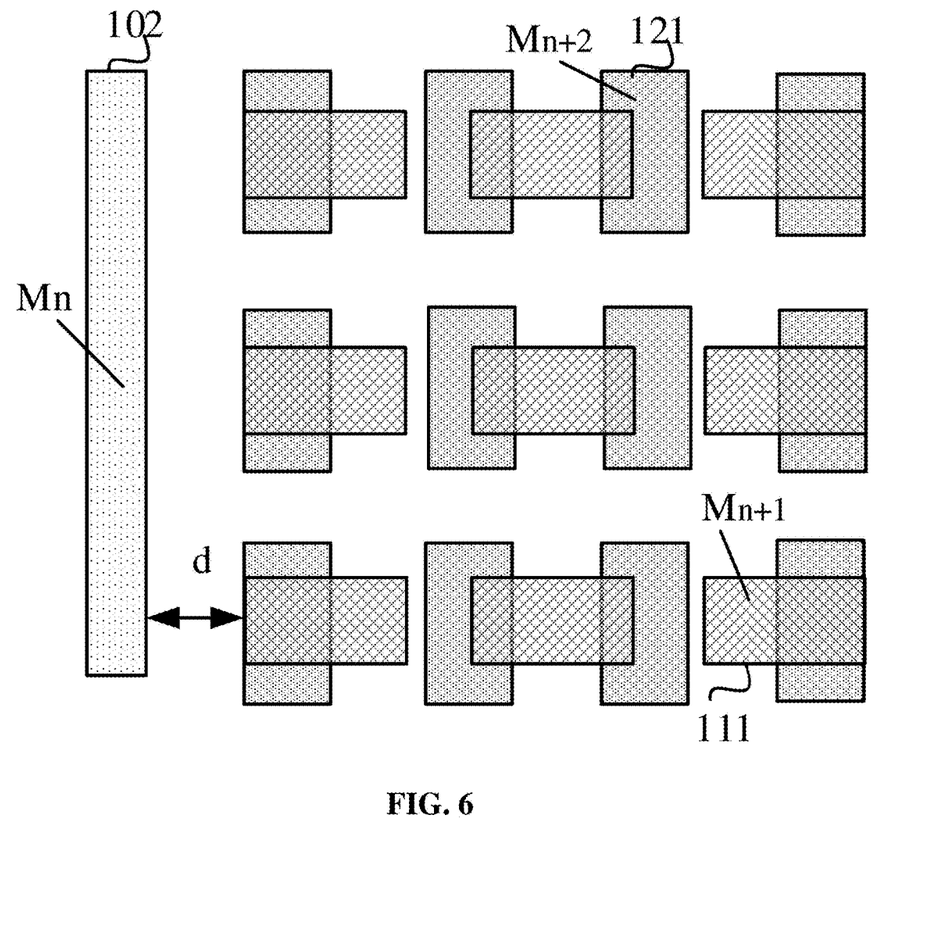
FIG. 6 illustrates a schematic layout diagram of the virtual metal blocks in the semiconductor structure according to the embodiment illustrated in FIG. 5.

FIG. 5 and FIG. 6 illustrate top views of a same semiconductor structure. FIG. 5 illustrates layout diagrams of the virtual metal blocks of the metal layer Mn and the metal layer Mn+1. FIG. 6 illustrates layout diagrams of the virtual metal blocks of the metal layer Mn+1 and the metal layer Mn+2.

As illustrates in FIG. 5, virtual metal blocks 101 arranged in an array are deployed on the metal layer Mn. Each virtual metal block 101 on the metal layer Mn is deployed along a first direction, for example, the first direction is the direction from top to bottom.

Virtual metal blocks 111 arranged in an array are deployed on the metal layer Mn+1. Each virtual metal block 111 on the metal layer Mn+1 is deployed along a second direction, the first direction is different from the second direction, for example, the second direction is the direction from left to right. The projections of virtual metal blocks 101 of the metal layer Mn on the substrate are partially overlapped with the projections of virtual metal blocks 111 of the metal layer Mn+1 on the substrate.

As illustrated in FIG. 6, virtual metal blocks 111 arranged in an array are deployed on the metal layer Mn+1. Each virtual metal block 111 on the metal layer Mn+1 is deployed along the second direction. Virtual metal blocks 121 arranged in an array are deployed on the metal layer Mn+2. Each virtual metal block 121 on the metal layer Mn+2 is deployed along the first direction, and the projections of virtual metal blocks 101 of the metal layer Mn on the substrate are completely overlapped with the projections of virtual metal blocks 121 of the metal layer Mn+2 on the substrate.

The wiring densities of the metal layer Mn, the metal layer Mn+1 and the metal layer Mn+2 may be effectively compensated by the above arrangement, so that the wiring of each metal layer is more uniform.

Figure 7:
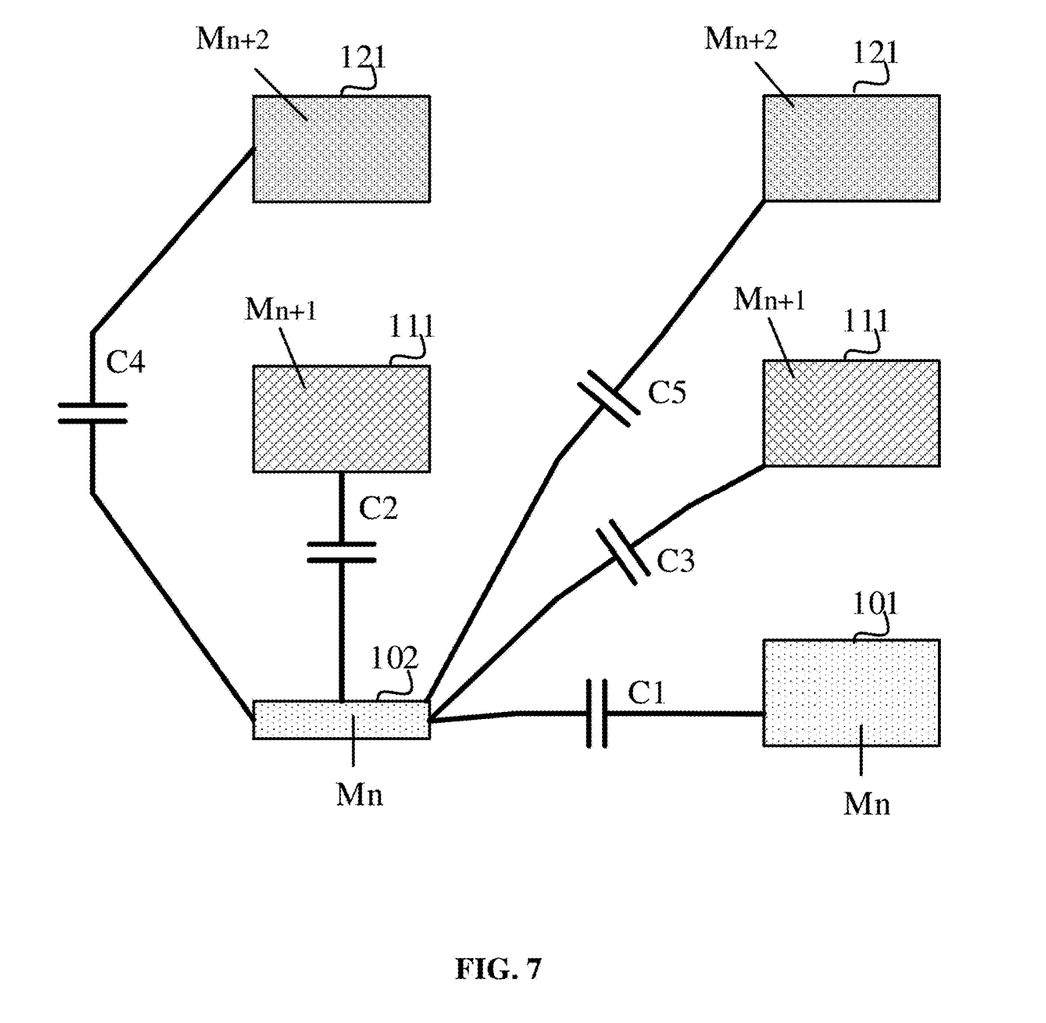
FIG. 7 illustrates a schematic diagram of parasitic capacitances between the signal lines and the virtual metal blocks according to one embodiment of the present disclosure.

However, the semiconductor structures illustrated in FIG. 5 and FIG. 6 introduce a relatively large parasitic capacitance on the signal lines. As illustrated in FIG. 7, the parasitic capacitance C1 between the signal line 102 and the virtual metal block 101 on the same layer is generated, the parasitic capacitance C2 between the signal line 102 and the virtual metal block 111 that is located directly above and on the Mn+1 layer is generated, the parasitic capacitance C3 between the signal line 102 and the virtual metal block 111 that is at upper right and on the Mn+1 layer is generated, the parasitic capacitance C4 between the signal line 102 and the virtual metal block 121 that is located directly above and on the Mn+2 layer is generated, and the parasitic capacitance C5 between the signal line 102 and the virtual metal block 121 that is at upper right and on the Mn+2 layer is generated.

It should also be noted that, in addition to the parasitic capacitance generated on the metal signal lines, parasitic capacitance is generated between the virtual metal blocks. Especially when the projections of virtual metal blocks on the substrate are overlapped, the parasitic capacitance is larger. When the parasitic capacitance between the virtual metal blocks is larger, the virtual metal blocks tend to collect charges during the manufacturing process, thus affecting the yield of manufacturing semiconductor structure.

Figure 8:
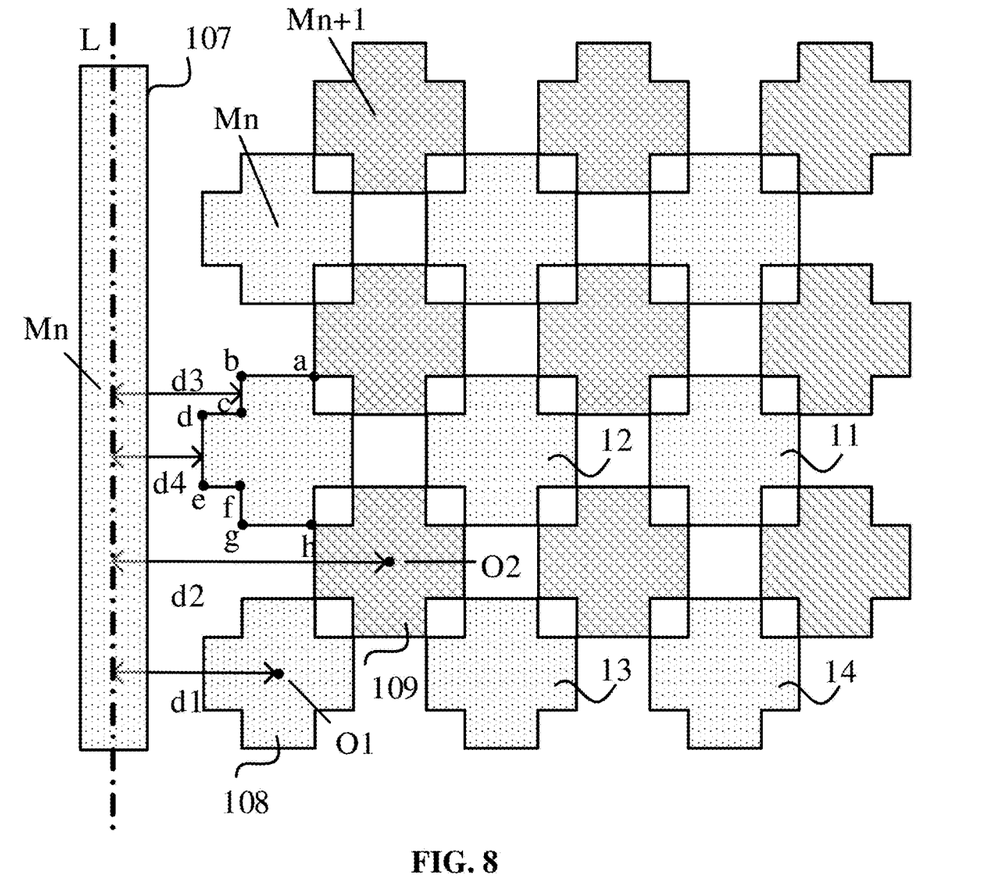
FIG. 8 illustrates a schematic layout diagram of the virtual metal blocks in each metal layer according to one embodiment of the present disclosure.
Figure 9:
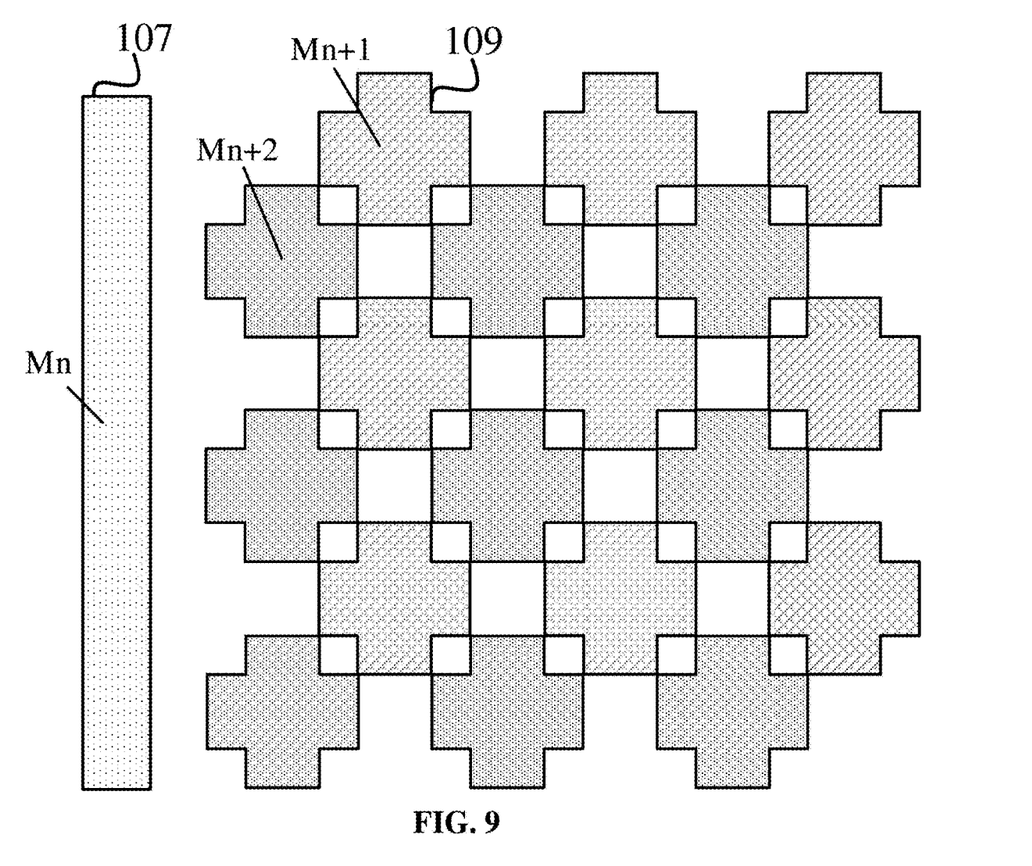
FIG. 9 illustrates a schematic layout diagram of the virtual metal blocks in the semiconductor structure according to the embodiment illustrated in FIG. 8.

As illustrated in FIGS. 8 and 9, the embodiments of the present disclosure provide a semiconductor structure. The semiconductor structure includes a plurality of metal layers 10 and a substrate 30. Each metal layer is provided with signal lines, virtual metal blocks are deployed on a metal layer where the signal lines are not uniformly distributed, and each virtual metal block has the same shape.

Virtual metal blocks on adjacent metal layers are staggered from each other in a direction perpendicular to the substrate. For example, the semiconductor structure is provided with P metal layers, virtual metal blocks are deployed on the metal layer Mn to metal layer Mn+2, the virtual metal blocks 101 on the metal layer Mn and the virtual metal blocks 111 on the metal layer Mn+1 are staggered from each other, and the virtual metal blocks 111 on the metal layer Mn+1 and the virtual metal blocks 121 on the metal layer Mn+2 are staggered from each other, where n+2≤P, both n and P are positive integers. The parasitic capacitance between virtual metal blocks on adjacent metal layers is greater than the parasitic capacitance between virtual metal blocks on non-adjacent metal layers. Since the virtual metal blocks on the adjacent metal layers are staggered from each other, the effective area of parasitic capacitance between the virtual metal blocks on the adjacent metal layers may be reduced, so that the parasitic capacitance between the virtual metal blocks may be reduced, the charge collected on the virtual metal blocks in the manufacturing process may be reduced, and the yield of manufacturing semiconductor structure may be improved.

One of the at least one signal line is selected as the target signal line 107, and the metal layer where the target signal line 107 is located is marked as the target metal layer. The virtual metal block, closest to the target signal line 107, on the target metal layer is marked as the first virtual metal block 108. As can be seen from FIG. 8, there are three virtual metal blocks in total may be used as the first virtual metal blocks 108 in the virtual metal blocks illustrated in FIG. 8.

The first projection of the first virtual metal block 108 on the substrate is a polygon, for example, quadrilateral, hexagonal, octagonal, etc. The first projection has a plurality of effective sides opposite to the second projection of the target signal line 107 on the substrate. That is, the effective sides of the first projection are sides where the parasitic capacitance between the first virtual metal block 108 and the target signal line 107 is generated. By setting the distances from the effective sides of the first projection to the straight line where the second projection is located are different, compared with setting the same distance from the effective sides of the first projection to the straight line where the second projection is located, too long distance from the first virtual metal block 108 to the target signal line 107 to reduce the parasitic capacitance may be avoided, and the distance is too long to easily make the wiring on the target metal layer non-uniform, or too short distance from the first virtual metal block 108 to the target signal line 107 to make the wiring on the target metal layer uniform may be avoided, and the distance is too short to increase the parasitic capacitance, that is, by setting different distances from the effective sides of the first projection to the straight line where the second projection is located, the wiring uniformity of the target metal layer and reduction of the parasitic capacitance of the target signal line 107 may be implemented.

In one embodiment, the projection of the virtual metal blocks on the substrate is a cross, hexagonal or octagonal. Taking the cross virtual metal blocks illustrated in FIG. 8 and FIG. 9 as an example, the effective sides of the first projection are ab, bc, cd, de, ef, fg, and gh, where the distance from bc to the straight line L and the distance from fg to the straight line L are equal, and are d3, the distance from de to the straight line L is d4, and the distances from ab, cd, ef, gh to the straight line L are also gradual.

In one embodiment, the projections of virtual metal blocks on adjacent two metal layers on the substrate do not overlap. The effective area of parasitic capacitance between virtual metal blocks on two adjacent metal layers may be further reduced, thereby reducing the parasitic capacitance between virtual metal blocks on two adjacent metal layers.

In one embodiment, a virtual metal block, closest to the target signal line 107, of virtual metal blocks on one of other metal layers is marked as the second virtual metal block 109, and the other metal layers are metal layers other than the target metal layer. A first distance d1 from the straight line L where the second projection is located to the geometric center O1 of the first projection is less than or equal to a second distance d2 from the straight line L where the second projection is located to the geometric center O2 of the third projection of the second virtual metal block 109 on the substrate. The second projection is the projection of the target signal line 107, that is, the second projection is in the shape of a strip, and the straight line L where the second projection is located is a straight line extending the second projection indefinitely in the length direction. The second virtual metal block 109 is further away from the target signal line 107, and the parasitic capacitance between the target signal line 107 and the virtual metal block on the other metal layer may be reduced. Furthermore, the first virtual metal block 108 is closer to the target signal line 107, and wiring uniformity on the target metal layer may be ensured.

In one embodiment, the first distance d1 from the straight line L where the second projection is located to the geometric center O1 of the first projection is less than or equal to the second distance d2 from the straight line L where the second projection is located to the geometric center O2 of the third projection of the second virtual metal block 109 on the substrate, and there are 2N metal layers between the metal layer where the second virtual metal block 109 is located and the target metal layer, N≥0, and N is an integer. For example, the target metal layer is the metal layer Mn, and the metal layer where the second virtual metal block 109 is located is the metal layer Mn+1. By setting in this way, the virtual metal blocks on the adjacent metal layers may be ensured to be staggered from each other, and the parasitic capacitance between the virtual metal blocks on the adjacent metal layers may be reduced.

In one embodiment, virtual metal blocks on each metal layer are distributed in an array. The wiring uniformity on each metal layer may be improved to avoid the formation of dished metal layers in the manufacturing of semiconductor structures and improve the yield of semiconductor structures.

In one embodiment, the projection matrix of the virtual metal blocks on the target metal layer on the substrate and the projection matrix of the virtual metal blocks on the metal layer where the second virtual metal block 109 is located on the substrate intersect each other. That is, the projection of part or all of the virtual metal blocks on the metal layer where the second virtual metal block 109 is located on the substrate is between the projections of a plurality of virtual metal blocks on the target metal layer on the substrate, or the projection of part or all of the virtual metal blocks on the target metal layer on the substrate may be between projections of a plurality of virtual metal blocks on the metal layer where the second virtual metal block 109 is located on the substrate. By this arrangement, it may be ensured that the projections of the virtual metal blocks on the adjacent metal layers on the substrate will not be overlapped, the parasitic capacitance between the virtual metal blocks on the adjacent metal layers is reduced, and the wiring in each metal layer is made uniform, and the yield of the semiconductor structure is improved.

In one embodiment, there is a projection of a virtual metal block on the metal layer where the second virtual metal block 109 is located among projections of four adjacent virtual metal blocks on the target metal layer. The projections of four adjacent virtual metal blocks on the substrate are located in different quadrants. For example, with continued reference to FIG. 8, the target metal layer is the metal layer Mn, and the metal layer where the second virtual metal block 109 is located is the metal layer Mn+1. The four adjacent virtual metal blocks on the target metal layer Mn are marked as a first adjacent virtual metal 11, a second adjacent virtual metal block 12, a third adjacent virtual metal block 13 and a fourth adjacent virtual metal block 14, the first adjacent virtual metal block 11 is located in the first quadrant, the second adjacent virtual metal block 12 is located in the second quadrant, the third adjacent virtual metal block 13 is located in the third quadrant, the fourth adjacent virtual metal block 14 is located in the fourth quadrant, and the projection of the virtual metal block of the metal layer Mn+1 is among the projections of the first adjacent virtual metal 11 to the fourth adjacent virtual metal block 14. Since the distances from the effective sides of the projection of the first virtual metal block 108 to the projection of the target signal line 107 are different, compared with the arrangement where the projection of virtual metal block of other metal layer is between projections of two virtual metal blocks located on the same row, the projection of the virtual metal block on the metal layer where the second virtual metal block 109 is located is among the projections of the four adjacent virtual metal blocks on the target metal layer, which may increase the densities of the virtual metal blocks on the metal layer where the second virtual metal block 109 is located and the target metal layer, so that the wirings on the metal layer where the second virtual metal block 109 is located and the target metal layer are uniform.

In one embodiment, the virtual metal blocks on each metal layer are distributed in a rectangular array, and the rectangular array distribution facilitates that the projection of the virtual metal block on the metal layer where the second virtual metal block 109 is located is distributed among the projections of adjacent virtual metal blocks in four different quadrants, and may increase the densities of the virtual metal blocks on the metal layer where the second virtual metal block 109 is located and the target metal layer, so that the wirings on the metal layer where the second virtual metal block 109 is located and the target metal layer are uniform.

In one embodiment, since the distances from the effective projection sides of the first virtual metal block 108 to the projection of the target signal line 107 are different, the gap between the virtual metal blocks on the target metal layer is more. By setting the projections of the virtual metal blocks on the two non-adjacent metal layers on the substrate to be overlapped, the projections of the virtual metal blocks on the two adjacent metal layers on the substrate do not overlap, when the virtual metal blocks on the metal layers that are adjacent to the target metal layer are arranged, the gap between the virtual metal blocks on the target metal layer may be fully utilized, so as to improve the density of the virtual metal blocks on each metal layer, and further make the wiring on each metal layer uniform.

In one embodiment, the projections of the virtual metal blocks on the overlapping metal layer on the substrate are overlapped with the projections of the virtual metal blocks on the target metal layer on the substrate. There are 2N+1 metal layers between overlapping metal layer and the target metal layer, N≥0, and N is an integer. The semiconductor structure is provided with P metal layers, the metal layer Mn is target metal layer, and the overlapping metal layers are metal layer M (n−2k), . . . , metal layer Mn−4, metal layer Mn−2, metal layer Mn+2, metal layer Mn+4, . . . , and Mn+2j, where N>2k, k, j are all taken as positive integers. FIG. 8 and FIG. 9 illustrate only the layouts of the virtual metal blocks on the metal layer Mn, the metal layer Mn+1, and the metal layer Mn+2, the metal layer Mn+2 is an overlapping metal layer, and the projections of the virtual metal blocks 121 on the metal layer Mn+2 on the substrate and the projections of the virtual metal blocks 101 on the metal layer Mn on the substrate are overlapped.

In one embodiment, the projections of virtual metal blocks on metal layers that differ from the target metal layer by 2N+1 metal layers on the substrate are overlapped, N≥0, and N is an integer. The metal layer Mn is a target metal layer, and the projections of virtual metal blocks on any two of the metal layers M(n−2k), . . . , Mn−4, Mn−2, Mn+2, . . . , Mn+2j on the substrate are overlapped.

In one embodiment, the target signal line 107 is selected from the at least one signal line according to the layout of the at least one signal line. The signal line, closest to the boundary of the signal line sparse region, in the signal line dense region, may be selected as the target signal line 107. Optionally the target signal line 107 may be selected by combining the distance to the boundary of the signal line sparse region and the wiring directions of the signal lines, the target signal line 107 may be selected by combining the distance to the boundary of the signal line sparse region, the wiring directions of the signal lines, and the type of the signal transmitted by the signal line, which is not limited herein.

In one embodiment, the target signal line 107 is configured to transmit the clock signal, and the clock signal has relatively high requirements for rising/falling edges. By taking the signal line configured to transmit the clock signal as the target signal line 107, the parasitic capacitance of the signal line configured to transmit the clock signal may be reduced, and the rising/falling edge of the clock signal may be ensured to be relatively steep.

Another embodiment of the present disclosure provides a semiconductor structure. The semiconductor structure includes a substrate, a first metal layer, a second metal layer, and a third metal layer. The first metal layer is the bottom metal layer, the second metal layer is higher than the first metal layer, and the third metal layer is higher than the second metal layer.

The first metal layer to the third metal layer are provided with signal lines, the first metal layer, the second metal layer and the third metal layer are provided with a plurality of virtual metal blocks, and the projection of each virtual metal block on the substrate is a cross. The signal line on the first metal layer is selected as the target signal line. The first virtual metal block is located on the first metal layer, and the second virtual metal block is located on the second metal layer.

The projections of the virtual metal blocks on the first metal layer on the substrate are distributed in a rectangular array, the projections of the virtual metal blocks on the second metal layer on the substrate are distributed in a rectangular array, and the projections of the virtual metal blocks on the third metal layer on the substrate are distributed in a rectangular array.

A projection of a virtual metal block on the second metal layer is among the projections of the four adjacent virtual metal blocks on the first metal layer, and the projections of the four adjacent virtual metal blocks on the substrate are located in different quadrants. The projections of virtual metal blocks on the first metal layer on the substrate are overlapped with the projections of virtual metal blocks on the third metal layer on the substrate.

In the above technical solution, the projections of the first virtual metal blocks are arranged to be a cruciform on the substrate, so that the distances from the effective sides of the first projection of the first virtual metal block to the straight line where the second projection of the target signal line on the substrate are different, the wiring of the target metal layer may be uniform, and the parasitic capacitance of the target signal line may be reduced. The projections of the virtual metal blocks on the first metal layer and the projections of the virtual metal blocks on the second metal layer do not overlap, the projections of the virtual metal blocks on the first metal layer and the projections of the virtual metal blocks on the third metal layer are overlapped, so that the gap between the virtual metal blocks on the first metal layer may be fully utilized, and the densities of the virtual metal blocks on the first metal layer to the third metal layer may be increased, so that the wirings of the first metal layer to the third metal layer are uniform. The virtual metal blocks on the first metal layer and the second metal layer are staggered in the direction perpendicular to the substrate, which may effectively reduce the parasitic capacitance between the virtual metal blocks on the first metal layer and the second metal layer, make the virtual metal blocks on the second metal layer farther away from the target signal line, and make the virtual metal blocks on the first metal layer closer to the target signal line, so as to ensure the wiring uniformity on the target metal layer, and also reduce the parasitic capacitance between the target signal line and the virtual metal block on the other metal layer.

Other implementation solutions of the present disclosure will be readily conceived of by those skilled in the art after considering the specification and practicing the invention disclosed herein. The present disclosure is intended to cover any variants, uses, or adaptations of the present disclosure that follow the general principles of the present disclosure and include well-known common sense or commonly-used technical means in the art that are not disclosed herein. The specification and embodiments are considered exemplary only, and the true scope and spirit of the present disclosure are indicated by the following claims.

It should be understood that the present disclosure is not limited to the precise structure already described above and illustrated in the accompanying drawings, and various modifications and changes may be made without departing from its scope. The scope of the present disclosure is limited only by the appended claims.

What is claimed is:

1. A semiconductor structure, comprising a plurality of metal layers and a substrate;
   wherein the plurality of metal layers are provided with a plurality of virtual metal blocks and at least one signal line;
   virtual metal blocks of two adjacent metal layers are staggered from each other in a direction perpendicular to the substrate;
   a first projection of a first virtual metal block on the substrate is a polygon, wherein the first virtual metal block is one of the plurality of virtual metal blocks of one of the plurality of metal layers, the first projection has a plurality of effective sides opposite to a second projection of a target signal line on the substrate, and distances from the plurality of effective sides of the first projection to a straight line where the second projection is located are different; and
   the first virtual metal block is a virtual metal block, closest to the target signal line, of a target metal layer, wherein the target metal layer is one of the plurality of metal layers, and the target metal layer is a metal layer where the target signal line is located;
   wherein projections of virtual metal blocks of non-adjacent two metal layers on the substrate are overlapped in the direction perpendicular to the substrate.

2. The semiconductor structure of claim 1, wherein projections of the virtual metal blocks of the two adjacent metal layers on the substrate do not overlap.

3. The semiconductor structure of claim 2, wherein a first distance from a straight line where the second projection is located to a geometric center of the first projection is less than or equal to a second distance from the straight line where the second projection is located to a geometric center of a third projection of a second virtual metal block on the substrate, wherein the second virtual metal block is one of the virtual metal blocks of one of the metal layers; and
   the second virtual metal block is a virtual metal block, closest to the target signal line, of metal layers other than the target metal layer.

4. The semiconductor structure of claim 3, wherein there are 2N metal layers between a metal layer where the second virtual metal block is located and the target metal layer, $N \geq 0$, and N is an integer.

5. The semiconductor structure of claim 4, wherein virtual metal blocks of each metal layer are distributed in an array.

6. The semiconductor structure of claim 5, wherein a projection matrix of virtual metal blocks of the target metal layer on the substrate and a projection matrix of virtual metal blocks of the metal layer where the second virtual metal block is located on the substrate are intersected with each other.

7. The semiconductor structure of claim 6, wherein a projection of a virtual metal block on the metal layer where the second virtual metal block is located is among projections of four adjacent virtual metal blocks on the target metal layer, and the projections of the four adjacent virtual metal blocks on the substrate are located in different quadrants.

8. The semiconductor structure of claim 7, wherein the virtual metal blocks of each metal layer are distributed in a rectangular array.

9. The semiconductor structure of claim 1, wherein projections of the virtual metal blocks of an overlapping metal layer on the substrate are overlapped with projections of virtual metal blocks of the target metal layer on the substrate;
   wherein there are 2N+1 metal layers between the overlapping metal layer and the target metal layer, $N \geq 0$, and N is an integer.

10. The semiconductor structure of claim 1, wherein projections of virtual metal blocks of metal layers with a difference of 2N+1 metal layers from the target metal layer on the substrate are overlapped, $N \geq 0$, and N is an integer.

11. The semiconductor structure of claim 10, wherein the plurality of metal layers comprise a first metal layer, a second metal layer, and a third metal layer, the first metal layer is a bottom metal layer, the second metal layer is higher than the first metal layer, and the third metal layer is higher than the second metal layer;

the first metal layer is provided with the target signal line, projections of virtual metal blocks of the first metal layer on the substrate are distributed in a rectangular array, projections of virtual metal blocks of the second metal layer on the substrate are distributed in a rectangular array, and projections of virtual metal blocks of the third metal layer on the substrate is distributed in a rectangular array;

a projection of a virtual metal block of the second metal layer is among projections of four adjacent virtual metal blocks of the first metal layer, the projections of the four adjacent virtual metal blocks on the substrate are located in different quadrants; and projections of virtual metal block of the first metal layer on the substrate are overlapped with the projections of virtual metal block of the third metal layer on the substrate.

12. The semiconductor structure of claim 1, wherein the projections of the virtual metal blocks on the substrate are cross, hexagonal or octagonal.

13. The semiconductor structure of claim 1, wherein the target signal line is selected from at least one signal line according to a layout of the at least one signal line.

14. The semiconductor structure of claim 13, wherein the target signal line is configured to transmit a clock signal.

* * * * *